(12) United States Patent
Chen et al.

(10) Patent No.: US 11,534,796 B2
(45) Date of Patent: Dec. 27, 2022

(54) ULTRASONIC TRANSDUCER

(71) Applicant: Unictron Technologies Corporation, Hsin-Chu (TW)

(72) Inventors: Lung Chen, Taipei (TW); Yi-Ting Su, Hsinchu (TW); San-Tang Chen, Taoyuan (TW); Tsung-Shou Yeh, Hsinchu County (TW); Ming-Chu Chang, Hsinchu County (TW)

(73) Assignee: Unictron Technologies Corporation, Hsin-Chu (TW)

( * ) Notice: Subject to any disclaimer, the term of this patent is extended or adjusted under 35 U.S.C. 154(b) by 490 days.

(21) Appl. No.: 16/745,291

(22) Filed: Jan. 16, 2020

(65) Prior Publication Data
US 2020/0376520 A1 Dec. 3, 2020

(30) Foreign Application Priority Data
May 30, 2019 (TW) ................. 108206826

(51) Int. Cl.
*B06B 1/06* (2006.01)
*G10K 11/02* (2006.01)
*H01L 41/083* (2006.01)
*H01L 41/25* (2013.01)

(52) U.S. Cl.
CPC ............ *B06B 1/0648* (2013.01); *G10K 11/02* (2013.01); *H01L 41/083* (2013.01); *H01L 41/25* (2013.01)

(58) Field of Classification Search
CPC ..... B06B 1/067; B06B 1/0674; B06B 1/0677; B06B 1/0681; B06B 1/0685; H01L 41/083; H01L 41/25; H04R 17/005

USPC ........................................................ 310/327
See application file for complete search history.

(56) References Cited

U.S. PATENT DOCUMENTS

| | | | | |
|---|---|---|---|---|
| 2,323,030 | A * | 6/1943 | Gruetzmacher | B06B 1/0644 310/365 |
| 4,420,707 | A * | 12/1983 | VanValkenburg | B06B 1/0681 310/327 |
| 4,482,835 | A * | 11/1984 | Bar-Cohen | G10K 11/165 310/334 |
| 4,680,499 | A * | 7/1987 | Umemura | G10K 11/02 73/644 |
| 5,332,943 | A * | 7/1994 | Bhardwaj | B06B 1/0681 73/644 |
| 5,375,099 | A * | 12/1994 | Gill | G10K 11/02 29/25.35 |

(Continued)

*Primary Examiner* — Matthew W Jellett
(74) *Attorney, Agent, or Firm* — Winston Hsu

(57) ABSTRACT

An ultrasonic transducer includes a carrier with a first surface and a second surface which are opposite to each other, a piezoceramic element attached on the first surface of the carrier, a first acoustic matching layer with a third surface and a fourth surface which are opposite to each other, the third surface is attached on the second surface of the carrier, wherein the first acoustic matching layer includes a mesh with openings, and the thickness of first acoustic matching layer is smaller than ¼ wavelength of an ultrasonic wave emitted by the piezoceramic element in the first acoustic matching layer in an operating frequency, and a total area of the openings of mesh is larger than 30% area of the third surface of first acoustic matching layer, and a second acoustic matching layer disposed on the fourth surface of the first acoustic matching layer.

6 Claims, 5 Drawing Sheets

(56) References Cited

U.S. PATENT DOCUMENTS

| | | | | |
|---|---|---|---|---|
| 5,457,352 A * | 10/1995 | Muller | ............... | G01F 23/296 |
| | | | | 310/334 |
| 5,629,906 A * | 5/1997 | Sudol | ............... | G10K 11/02 |
| | | | | 310/326 |
| 6,051,913 A * | 4/2000 | King | ............... | H04R 1/00 |
| | | | | 310/322 |
| 6,540,683 B1 * | 4/2003 | Lin | ............... | G01S 7/52074 |
| | | | | 600/458 |
| 6,849,053 B2 * | 2/2005 | Bechtold | ............... | G10K 15/043 |
| | | | | 181/207 |
| 6,995,500 B2 * | 2/2006 | Yogeswaren | ............... | B06B 1/0622 |
| | | | | 310/334 |
| 7,061,163 B2 * | 6/2006 | Nagahara | ............... | G10K 11/02 |
| | | | | 310/334 |
| 7,084,552 B2 * | 8/2006 | Bhardwaj | ............... | H04R 17/00 |
| | | | | 310/327 |
| 7,105,986 B2 * | 9/2006 | Wildes | ............... | G10K 11/004 |
| | | | | 310/334 |
| 8,354,773 B2 * | 1/2013 | Oliver | ............... | A61B 8/4483 |
| | | | | 310/327 |
| 2008/0303381 A1 * | 12/2008 | Yuu | ............... | C08K 3/22 |
| | | | | 427/221 |
| 2011/0290028 A1 * | 12/2011 | Matsumoto | ............... | G10K 9/22 |
| | | | | 73/658 |
| 2013/0038174 A1 * | 2/2013 | Kim | ............... | H01L 41/1132 |
| | | | | 310/327 |
| 2013/0112000 A1 * | 5/2013 | Kim | ............... | G01S 7/52006 |
| | | | | 73/644 |
| 2014/0292147 A1 * | 10/2014 | Kim | ............... | B06B 1/06 |
| | | | | 156/280 |
| 2015/0270474 A1 * | 9/2015 | Osawa | ............... | A61B 8/4494 |
| | | | | 310/327 |

* cited by examiner

ULTRASONIC TRANSDUCER

BACKGROUND OF THE INVENTION

1. Field of the Invention

The present invention relates generally to an ultrasonic transducer, and more specifically, to an ultrasonic transducer with dual acoustic matching layers, wherein one of the acoustic matching layers includes mesh.

2. Description of the Prior Art

Ultrasonic transducer may be used in short-range object detection. Through calculation of the time difference between emitting waves and reflected waves from objects, the distance between ultrasonic transducer and detected object may be obtained. In the field of ultrasonic detection, the types and properties of objects to be detected is not quite restrictive. Solid, liquid or particle with various surface colors, transparencies and hardness may all be detected by using the ultrasonic transducer. Therefore, the ultrasonic transducer nowadays is widely used in the fields like parking sensors, level sensors, multiple sheet detection and flow meter.

The main component of an ultrasonic transducer is piezoceramic element, for example, the ceramic element made of lead zirconate titanate (PZT) material with two opposite surfaces coated with conductive layers to apply high-frequency alternating current signal in the operation, so that the piezoceramic element would generate high-frequency vibration. This high-frequency vibration is a kind of wave energy. It may be in a form of ultrasonic wave, i.e. ultrasonic vibration, if its wavelength falls within the range of ultrasound. However, in order to transmit the generated ultrasonic waves from the piezoceramics into air, the acoustic impedances of piezoceramics and air should be matched.

The formula to calculate the acoustic impedance (Z) is $Z = \rho c$ ($\rho$=material density, c=ultrasonic velocity). The acoustic impedance of piezoceramic is about 30-35 MRayl ($10^6$ kg/m²S), while the acoustic impedance of air is about 430 Rayl (kg/m²S). Since there is a huge gap between the acoustic impedances of piezoceramic and air, the ultrasonic energy generated by the piezoceramic can't be transmitted to air. Therefore, the acoustic matching layer becomes a critical component in ultrasonic transducers. The acoustic matching layer is designed to be disposed between the piezoceramic and air to match the acoustic impedances thereof, so that the ultrasonic wave may be effectively transmitted to air. The ideal value of acoustic impedance for the acoustic matching layer used in air transducer is $\sqrt{(35M \cdot 430)}$ Rayl, i.e. about 0.12 MRayl. However, it is hard to find a durable material with acoustic impedance lower than 1 MRayl in nature. Therefore, commonly-used material of the acoustic matching layer in transducer industry is composite material with mixed polymer resin and hollow glass particles, to achieve lower acoustic impedance, and at the same time, provide better weatherability and reliability.

SUMMARY OF THE INVENTION

The summary of present invention is provided in following paragraphs to assist readers having a better understanding of the subject matter of present invention. The summary is presented to be not exhaustive and/or exclusive to the features and advantages of the present invention, and doesn't intend to list all crucible or essential elements or to limit the scope of present invention. With the purpose just to provide certain concepts relied therein to be described through embodiments in a simplified form, detailed features and advantages of the invention will become apparent in the following description, from the drawings, and from the claims.

In order to obtain an ultrasonic transducer with broader bandwidth, the present invention hereby provides a novel ultrasonic transducer, with structural design of dual acoustic matching layers and mesh to increase not only the bandwidth of ultrasonic transducers, but also prevent the reliability issues caused by stress.

One aspect of the present invention is to provide an ultrasonic transducer, including: a carrier with a first surface and a second surface opposite to the first surface across the carrier, a piezoceramic element attached on the first surface of carrier, a first acoustic matching layer with a third surface and a fourth surface opposite to the third surface across the first acoustic matching layer, wherein the third surface is attached on the second surface of carrier, and the first acoustic matching layer includes a mesh with openings, and a thickness of the first acoustic matching layer is smaller than ¼ wavelength of an ultrasonic wave emitted by the piezoceramic element in the first acoustic matching layer in an operating frequency of the ultrasonic transducer, and a total area of the openings of mesh is larger than 30% area of the third surface of first acoustic matching layer, and a second acoustic matching layer disposed on the fourth surface of first acoustic matching layer.

Another aspect of the present invention is to provide an ultrasonic transducer, including: a carrier with a first surface and a second surface opposite to the first surface across the carrier, a piezoceramic element, a first acoustic matching layer with a third surface and a fourth surface opposite to the third surface across the first acoustic matching layer, wherein the third surface is attached on a surface of the piezoceramic element, and the first acoustic matching layer includes a mesh with openings, and a thickness of the mesh is smaller than ¼ wavelength of an ultrasonic wave emitted by the piezoceramic element in the first acoustic matching layer in an operating frequency of the ultrasonic transducer, and a total area of the openings of mesh is larger than 30% area of the third surface of first acoustic matching layer, and a second acoustic matching layer with a fifth surface and a sixth surface opposite to the fifth surface across the second acoustic matching layer, wherein the fifth surface is attached on the fourth surface of first acoustic matching layer, and the sixth surface is attached on the first surface of the carrier.

Still another aspect of the present invention is to an ultrasonic transducer, including: a piezoceramic element, a first acoustic matching layer with a first surface and a second surface opposite to the first surface across the first acoustic matching layer, wherein the first surface is attached on a surface of the piezoceramic element, and the first acoustic matching layer includes a mesh with openings, and a thickness of the mesh is smaller than ¼ wavelength of an ultrasonic wave emitted by the piezoceramic element in the first acoustic matching layer in an operating frequency of the ultrasonic transducer, and a total area of the openings of mesh is larger than 30% area of the first surface of the first acoustic matching layer, a second acoustic matching layer with a third surface and a fourth surface opposite to the third surface across the second acoustic matching layer, and the third surface is attached on the second surface of first acoustic matching layer, a damping element encapsulating the piezoceramic element and/or the first acoustic matching layer and/or the second acoustic matching layer, and a carrier with an inner surface and an outer surface opposite to each other and a first opening and a second opening opposite to each other across the carrier, wherein the inner surface of carrier surrounds and is attached on the damping element, and the fourth surface of second acoustic matching layer is exposed from the first opening of the carrier.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
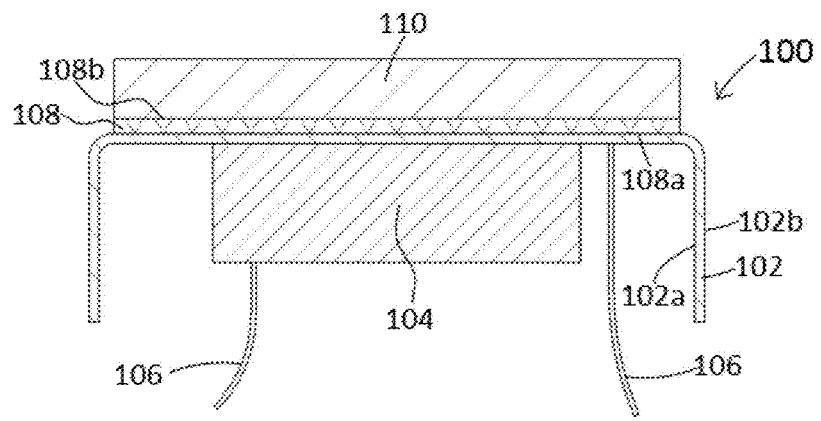
FIG. 1 is a cross-sectional view illustrating one mode of the ultrasonic transducer in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Dimensions and proportions of certain parts of the drawings may have been shown exaggerated or reduced in size, for the sake of clarity and convenience in the drawings. Other embodiments may be utilized and structural, logical, and electrical changes may be made without departing from the scope of the present invention. The following detailed description, therefore, is not to be taken in a limiting sense, and the scope of the present invention is defined by the appended claims.

First, please refer to FIG. 1, which is a cross-sectional view illustrating one mode of the ultrasonic transducer in accordance with one embodiment of the present invention. In this embodiment, the ultrasonic transducer 100 includes a barrel-shaped carrier 102 with a first surface 102a and a second surface 102b opposite to each other across the carrier 102. A piezoelectric element 104 is attached on and directly contacts the first surface 102a of the carrier 102. The conductive layer on the piezoceramic element 104 may be connected with conductive wires 106 (or connected through the carrier 102 with direct contact), to electrically connect external high-frequency alternating current signal to the piezoceramic element 104 and generate high-frequency vibration to emit ultrasonic waves. The piezoceramic element may include solid piezoceramic material in a shape of square, polygon or circle, or multi-layer ceramic piezoceramic material, or a piezoceramic material with grooves. These piezoceramic materials may include leaded piezoceramic material like $Pb(ZrTi)O_3$, $PbTiO_3$, or unleaded piezoceramic material like $BaTiO_3$, $(NaK)NbO_3$, with an acoustic impedance about 30-35 MRayl much greater than the acoustic impedance of air (about 430 Rayl), thus an acoustic matching layer is required to match the acoustic impedances in these two mediums.

Refer still to FIG. 1. A first acoustic matching layer 108 is provided with a third surface 108a and a fourth surface 108b opposite to each other across the first acoustic matching layer 108, wherein the third surface 108a is attached on and directly contacts the second surface 102b of the carrier. A second acoustic matching layer 110 is disposed on the fourth surface 108b of the first acoustic matching layer 108. Please note that in the embodiment of present invention, the first acoustic matching layer 108 features an internal mesh sheet with openings to precisely control the thickness of the first acoustic matching layer 108 and obtain excellent acoustic matching. Detailed features of the mesh sheet will be described in following embodiments and drawings.

In real implementation, the mesh sheet is put on a predetermined surface that is to be formed with the first acoustic matching layer 108, such as the second surface 102b of the carrier 102. The material of the first acoustic matching layer 108 is then uniformly applied on the second surface 102b of the carrier 102, so that the material and the mesh sheet combine to form the first acoustic matching layer 108. The material of the mesh sheet is selected from metallic materials of following group or the combination thereof: copper, iron, nickel, stainless steel, aluminum or titanium, or is selected from non-metallic materials of following group: polytetrafluoroethylene (PTFE), polyethylene terephthalate (PET), Nylon, carbon fiber or glass fiber. The material of the first acoustic matching layer 108 may be organic polymer materials or a composite material made of mixed organic polymer materials with hollow or solid particles. For example, the material of organic polymer materials includes epoxy, vinyl ester resin, UV resin, polyurethane or acrylic resin. The hollow or solid particles may be hollow glass particles or solid glass particles, as a filler to be uniformly distributed in the organic polymer materials to adjust total density of the first acoustic matching layer 108. The density of hollow glass particles is between 0.1 g/cm$^3$ to 0.6 g/cm$^3$. Since the acoustic impedance is proportional to the density of material, the lower the density of first acoustic matching layer 108 is, the lower the acoustic impedance is obtained, so that better acoustic matching may be achieved. The first acoustic matching layer 108 may be modulated with different densities by adding the glass particles with different percentage by volume into the organic polymer materials and undergo mixing, degassing and curing treatment.

Due to presence of the mesh sheet, when the second acoustic matching layer 110 is pressed on the material of first acoustic matching layer 108 in later process, the material of the first acoustic matching layer 108 may function as an adhesive to bind the second acoustic matching layer 110 tightly on the carrier 102, wherein the mesh sheet provides mechanical support to make the thickness of the pressed first acoustic matching layer 108 equal to the thickness of the mesh sheet and achieve the precise controlling the thickness of the acoustic matching layer. In the embodiment of present invention, the thickness of the first acoustic matching layer 108 should be smaller than ¼ wavelength of the ultrasonic wave emitted by the piezoceramic element 104 in the first acoustic matching layer 108 in an operating frequency of the ultrasonic transducer 100, to achieve optimal ultrasonic transmission. In addition, since the coefficient of thermal expansion of the first acoustic matching layer 108 is much greater than the coefficient of thermal expansion of the carrier 102 on which it attaches, the mesh sheet in the first acoustic matching layer 108 may also absorb the stress generated by the matching layers to prevent the failure of device's reliability.

Refer again to FIG. 1. As stated above, the second acoustic matching layer 110 is tightly bond on the carrier 102 through the first acoustic matching layer 108 to form a dual-layered acoustic matching structure. The advantage of dual-layered acoustic matching structure is significantly increasing bandwidth for the ultrasonic transducer. In the embodiment of present invention, the material of second acoustic matching layer 110 may be organic polymer materials or a composite material made of mixed organic polymer materials with hollow or solid particles. The material of organic polymer materials includes epoxy, phenolic resin, vinyl ester resin, polyurethane, acrylic resin or cyanate ester resin. The hollow or solid particles may be hollow glass particles or solid glass particles, as a filler to be uniformly distributed in the organic polymer materials to adjust total density of the second acoustic matching layer 110. The density of hollow glass particle is between 0.1 g/cm$^3$ to 0.6 g/cm$^3$. Since the acoustic impedance is proportional to the density of material, the lower the density of the second acoustic matching layer 110 is, the lower the acoustic impedance is obtained, so that better acoustic matching may be achieved. The second acoustic matching layer 110 may be modulated with different densities by adding the glass particles with different percentage by volume into the organic polymer materials and undergo mixing, degassing and curing treatment.

Figure 2:
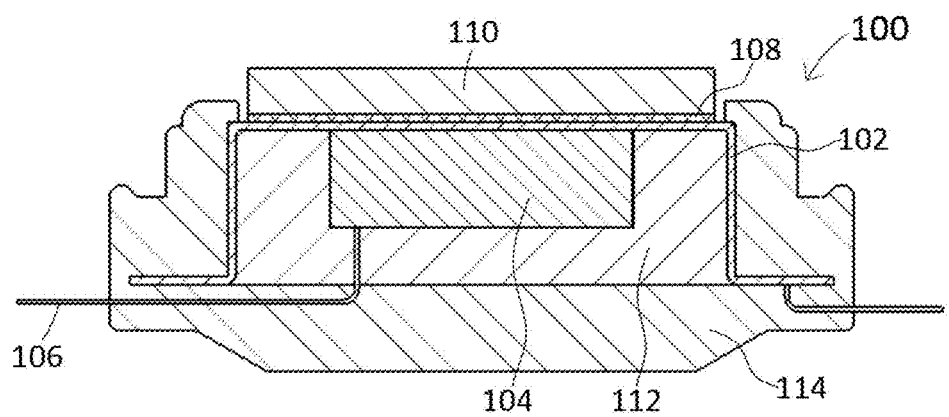
FIG. 2 is a cross-sectional view illustrating another mode of the ultrasonic transducer in accordance with one embodiment of the present invention.

Next, please refer to FIG. 2. In addition to the aforementioned components, the ultrasonic transducer 100 of present invention may further include damping structure. As shown in FIG. 2, a first damping element 112 is disposed in the barrel-shaped carrier 102. The first damping element 112 is disposed in the space between the barrel-shaped carrier 102 and the piezoceramic element 104 and encapsulates the piezoceramic element 104, so that the first damping element 112 may effectively buffer to lower the ringing of the ultrasonic transducer under high-frequency vibration in the operation of piezoceramic element 104. In addition, a second damping element 114 may be further disposed to encapsulate the first damping element 112 and the barrel-shaped carrier 102 and provide improved damping effect. As shown in the figure, the second damping element 114 may encapsulate entire barrel-shaped carrier 102, including its sidewall and flange. The transmission surface of the second acoustic matching layer 110 is exposed from the second damping element 114. The second damping element 114 may also fix the conductive wires 106. In the embodiment, the damping coefficients of first damping element 108 and second damping element 110 are different, so that these two damping elements with different types and configurations may further effectively damping the piezoceramic element 104 in high-frequency vibration and reset it into static state. This function facilitates the operation of ultrasonic transducer.

Figure 3:
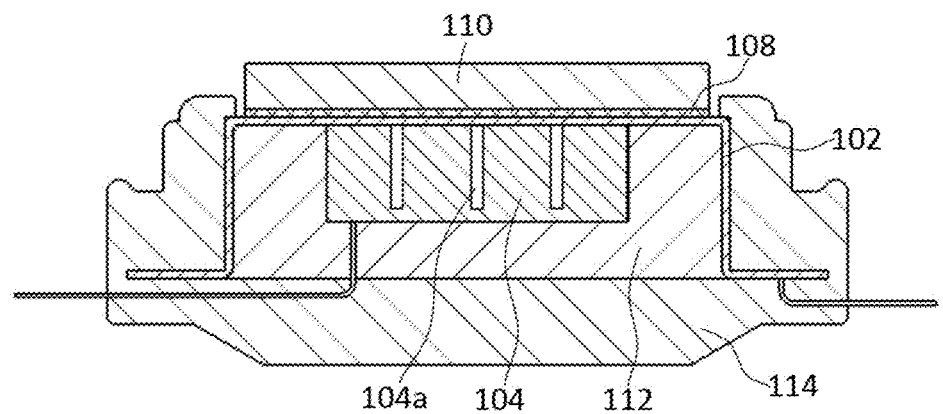
FIG. 3 is a cross-sectional view illustrating still another mode of the ultrasonic transducer in accordance with one embodiment of the present invention.
Figure 4:
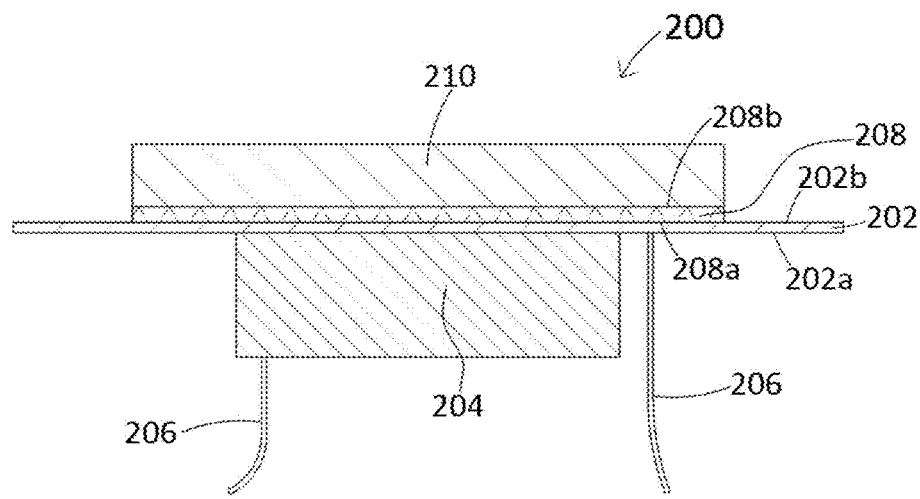
FIG. 4 is a cross-sectional view illustrating still another mode of the ultrasonic transducer in accordance with one embodiment of the present invention.

Next, please refer to FIG. 4, which is a cross-sectional view illustrating another mode of the ultrasonic transducer in accordance with one embodiment of the present invention. In the embodiment of FIGS. 1-3, the piezoceramic element and the acoustic matching layers are disposed on the barrel-shaped carrier. However, in the embodiment of present invention, the piezoceramic element and the acoustic matching layers are disposed on a surface of a plate carrier. As shown in the figure, the ultrasonic transducer 200 includes a plate carrier 202 with a first surface 202*a* and a second surface 202*b* opposite to each other across the plate carrier 202. A piezoceramic element 204 is attached on and directly contacts the first surface 202*a* of the plate carrier 202. A first acoustic matching layer 208 is provided with a third surface 208*a* and a fourth surface 208*b* opposite to each other across the first acoustic matching layer 208, wherein the third surface 208*a* is attached on and directly contacts the second surface 202*b* of the plate carrier 202. A second acoustic matching layer 210 is disposed on the fourth surface 208*b* of the first acoustic matching layer 208. Other detailed features of the ultrasonic transducer 200 are identical to the ultrasonic transducer 100 shown in FIG. 1. Those features will not be herein repeated.

Figure 5:
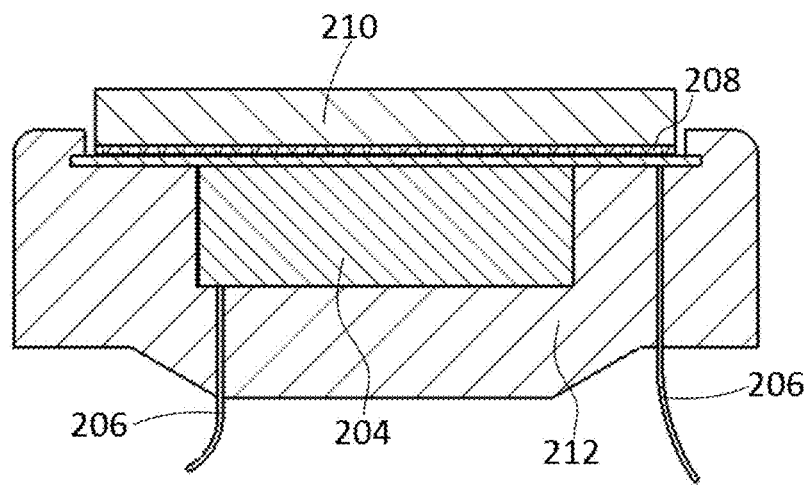
FIG. 5 is a cross-sectional view illustrating still another mode of the ultrasonic transducer in accordance with one embodiment of the present invention.

Next, please refer to FIG. 5. In addition to the aforementioned components, the ultrasonic transducer 200 of present invention may further include damping structures. As shown in FIG. 5, a damping element 212 encapsulates entire piezoceramic element 204 and plate carrier 202. The transmission surface of the second acoustic matching layer 210 is exposed from the damping element 212. The damping element 212 may effectively buffer to lower the ringing of ultrasonic transducer. The damping element 212 may also fix the conductive wires 206.

Figure 6:
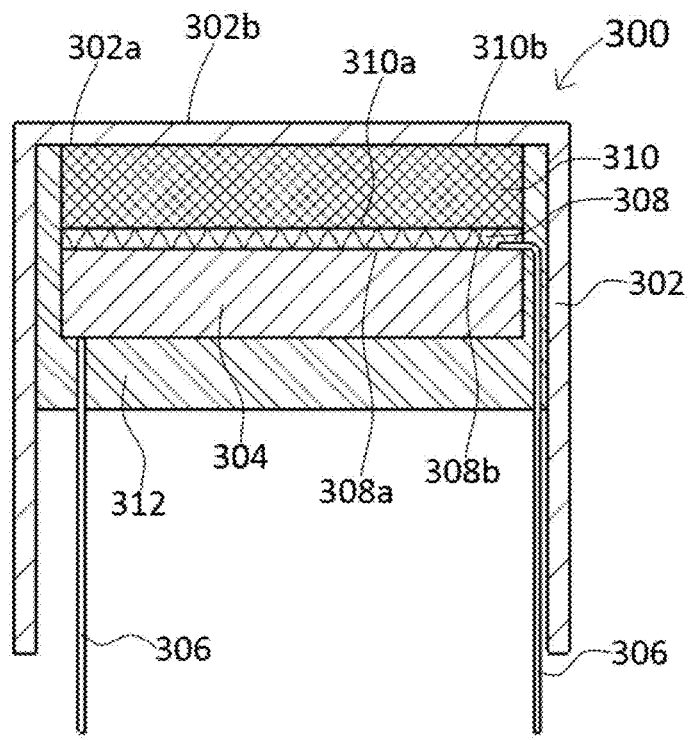
FIG. 6 is a cross-sectional view illustrating still another mode of the ultrasonic transducer in accordance with one embodiment of the present invention.

The aforementioned embodiments as shown in FIGS. 1-5 are basic modes of the ultrasonic transducer of present invention, wherein the piezoceramic element and the acoustic matching layers are disposed respectively inside and outside the barrel-shaped carrier 102, or be disposed respectively two sides of the plate carrier 202. Now, please refer to FIG. 6, is a cross-sectional view illustrating still another mode of the ultrasonic transducer in accordance with one embodiment of the present invention. The framework of ultrasonic transducer in this embodiment is essentially the same as the one shown in FIG. 1, with the only difference lies in both of the piezoceramic element and the acoustic matching layers disposed in the barrel-shaped carrier.

As shown in FIG. 6, the ultrasonic transducer 300 includes a barrel-shaped carrier 302 with a first surface 302*a* and a second surface 302b opposite to each other across the carrier, and a piezoceramic element 304. A first acoustic matching element 308 is provided with a third surface 308a and a fourth surface 308b opposite to each other across the first acoustic matching element, wherein the third surface 308a is attached on and directly contacts a surface of the piezoceramic element 304. The conductive layers on the front surface and back surface of the piezoceramic element 304 may be connected with conductive wires 306, to electrically connect external high-frequency alternating current signal to the piezoceramic element 304 and generate high-frequency vibration to emit ultrasonic wave.

Refer still to FIG. 6. A second acoustic matching layer 310 is provided with a fifth surface 310a and a sixth surface 310b opposite to each other across the second acoustic matching layer, wherein the fifth surface 310a is attached on and directly contacts the fourth surface 308b of the first acoustic matching layer 308, and the sixth surface 310b is attached on the first surface 302a of barrel-shaped carrier 302. Please note that in this embodiment of present invention, the first acoustic matching layer 304 is also provided with an internal mesh sheet to precisely control the thickness of the first acoustic matching layer 304 and obtain excellent acoustic matching. Detailed features of the mesh sheet will be described in following embodiments and drawings. The ultrasonic transducer is also provided with damping structures. As shown in the figure, a damping element 312 is disposed in the barrel-shaped carrier 302. The damping element 312 is disposed in the space between the barrel-shaped carrier 302 and the piezoceramic element 304 and encapsulates the piezoceramic element 304, so that the damping element 312 may effectively buffer to lower the ringing of the ultrasonic transducer under high-frequency vibration in the operation of piezoceramic element 304. The damping element 312 may also fix the conductive wires 306.

Unlike the embodiment of FIG. 1, the acoustic matching layers 308, 310 in the embodiment above are disposed in barrel-shaped carrier 302 along with the piezoceramic element 304. This design is more suitable for the transducer to be used in external harsh environment in comparison to the design of FIG. 1, to effectively protect the acoustic matching layers from damage.

Figure 7:
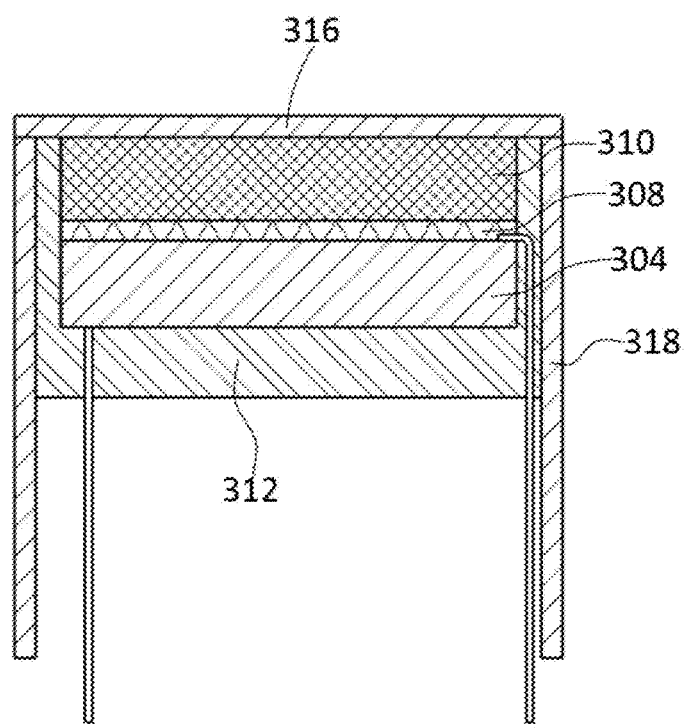
FIG. 7 is a cross-sectional view illustrating still another mode of the ultrasonic transducer in accordance with one embodiment of the present invention.

Next, please refer to FIG. 7, which is a cross-sectional view illustrating still another mode of the ultrasonic transducer in accordance with one embodiment of the present invention. In the aforementioned embodiments, the barrel-shaped carrier 302 may be made by combination mode. As shown in figure, a combination structure of the piezoceramic element 304, the first acoustic matching layer 308 and the second acoustic matching layer 310 may be first attached on a plate carrier 316, and a cylindrical or frame casing 318 is then mounted surrounding the plate carrier 316, so that the plate carrier 316 and the casing 318 may constitute the barrel-shaped carrier 302. Thereafter, damping material may be filled in the barrel-shaped carrier 302 to form damping element 312 and complete the manufacture of the ultrasonic transducer 300. In comparison to one-piece barrel-shaped carrier 302 of FIG. 6, the advantage of this embodiment is facilitating the manufacture, and the shape of product may be easily customized.

Figure 8:
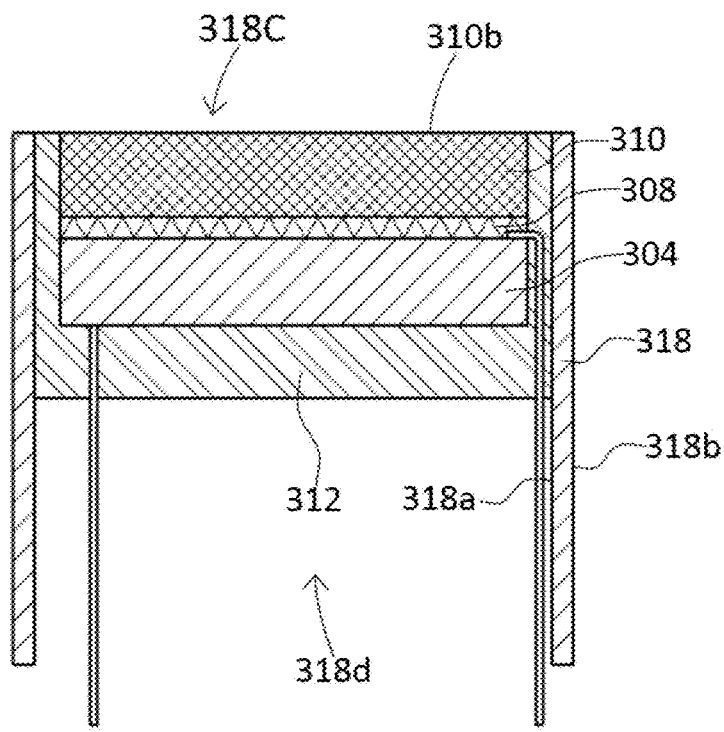
FIG. 8 is a cross-sectional view illustrating still another mode of the ultrasonic transducer in accordance with one embodiment of the present invention.

Lastly, please refer to FIG. 8, which is a cross-sectional view illustrating still another mode of the ultrasonic transducer in accordance with one embodiment of the present invention. The embodiments of FIG. 8 and FIG. 7 are essentially the same, with the only difference lies in the carrier 302 in FIG. 8 is only a cylindrical or frame casing 318. While the plate portion 316 is removed from the carrier, entire combination structure of piezoceramic element 304, first acoustic matching layer 308 and second acoustic matching layer 310 is fixed on the casing 318 through the damping element 312. As shown in figure, the casing 318 is provided with an inner surface 318a and an opposite outer surface 318b and a first opening 318c and an opposite second opening 318d, wherein the inner surface 318a surrounds and is attached on the damping element 312. In addition, the fourth surface 310b of second acoustic matching layer 310 is exposed from the first opening 318c of casing 318 since the plate portion is removed.

Figures 9, 10:
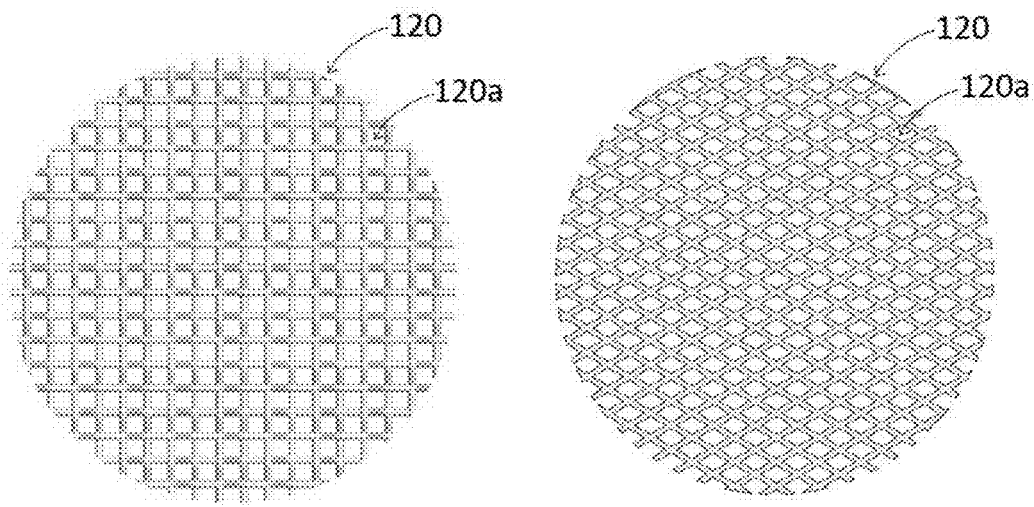
FIG. 9 is a schematic view of a mesh of the ultrasonic transducer in accordance with one embodiment of the present invention.
FIG. 10 is a schematic view of a mesh of the ultrasonic transducer in accordance with one embodiment of the present invention.
Figure 11:
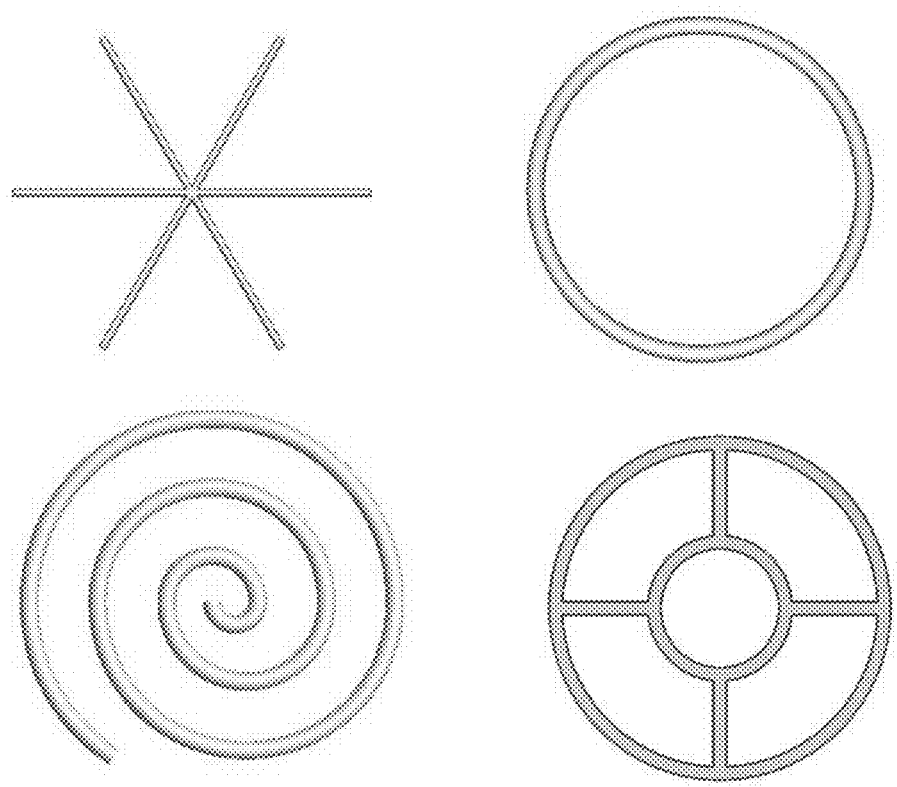
FIG. 11 is a schematic view of various openings of the mesh in accordance with one embodiment of the present invention.

Now, please refer to FIGS. 9-11, which illustrate detailed features of the mesh sheet inside the first acoustic matching layer. In FIG. 9, the mesh sheet 120 is a braid mesh structure, wherein threads are arranged in a crisscross pattern to form the mesh sheet 120 with multiple openings 120a. In the embodiment of present invention, the total area of these openings 120a is larger than 30% surface area of the first acoustic matching layer so that the mesh would not hinder the transmission of ultrasonic waves. As aforementioned, the material of these threads may be selected from metallic materials of following group or the combination thereof: copper, iron, nickel, stainless steel, aluminum or titanium, or may be selected from non-metallic materials of following group: polytetrafluoroethylene (PTFE), polyethylene terephthalate (PET), Nylon, carbon fiber or glass fiber.

Unlike the braid mesh structure shown in FIG. 9, the mesh sheet 120 in FIG. 10 is expanded mesh structure with rhombus openings 120a. Similarly, the total area of these openings 120a is larger than 30% surface area of the first acoustic matching layer so that the mesh would not hinder the transmission of ultrasonic waves.

Now, please refer to FIG. 11. In addition to the aforementioned braid mesh structure and expanded mesh structure, alternatively, the sheet 120 inside the first acoustic matching layer may be other types. As shown in FIG. 11, the shape of sheet 120 may be ringlike, multiple ringlike, spiral, or linear. In the present invention, the key point is the sheet 120 should have predetermined thickness, and the total area of its openings should be larger than 30% surface area of the acoustic matching layer.

According to the ultrasonic transducer made by the aforementioned exemplary embodiments, the mesh sheet is provided in the acoustic matching layer to precisely control the thickness of acoustic matching layer and obtain excellent acoustic matching. In addition, the mesh sheet is beneficial to absorb the stress generated by the matching layer, thereby improving the weatherability and the reliability of devices. Furthermore, the design of dual-layered acoustic matching structure may significantly increase the bandwidth of the ultrasonic transducer. In conclusion, it is an invention with both novelty and practicality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An ultrasonic transducer, comprising:
   a barrel-shaped carrier with a first surface and a second surface opposite to said first surface across said barrel-shaped carrier;
   a piezoceramic element attached on said first surface of said barrel-shaped carrier and disposed in said barrel-shaped carrier;

a first acoustic matching layer with a third surface and a fourth surface opposite to said third surface across said first acoustic matching layer, wherein said third surface is attached on said second surface of said barrel-shaped carrier, and said first acoustic matching layer comprises a mesh with openings, and a thickness of said first acoustic matching layer is smaller than ¼ wavelength of an ultrasonic wave emitted by said piezoceramic element in said first acoustic matching layer in an operating frequency of said ultrasonic transducer, and a total area of said openings of said mesh is larger than 30% area of said third surface of said first acoustic matching layer;

a second acoustic matching layer disposed on said fourth surface of said first acoustic matching layer, and said first acoustic matching layer and said second acoustic matching layer are disposed outside said barrel-shaped carrier; and a first damping element disposed in said barrel-shaped carrier and encapsulating said piezoceramic element and a second damping element encapsulating said first damping element and said barrel-shaped carrier.

2. The ultrasonic transducer of claim 1, wherein said mesh is rhombus mesh structure.

3. The ultrasonic transducer of claim 1, wherein a material of said mesh is selected from metallic materials of following group or the combination thereof: copper, iron, nickel, stainless steel, aluminum or titanium, or is selected from non-metallic materials of following group: polytetrafluoroethylene (PTFE), polyethylene terephthalate (PET), Nylon, carbon fiber or glass fiber.

4. The ultrasonic transducer of claim 1, wherein said first acoustic matching layer comprises said mesh and organic polymer materials or comprises a composite material made of said mesh mixing with said organic polymer materials and hollow or solid particles, and a material of said organic polymer materials comprises epoxy, vinyl ester resin, UV resin, polyurethane or acrylic resin.

5. The ultrasonic transducer of claim 1, wherein said second acoustic matching layer comprises organic polymer materials or comprises a composite material made of said organic polymer materials mixing with hollow or solid particles, and a material of said organic polymer materials comprises epoxy, phenolic resin, vinyl ester resin, polyurethane, acrylic resin or cyanate ester resin.

6. The ultrasonic transducer of claim 1, wherein said piezoceramic element comprises solid piezoceramic material in a shape of square, polygon or circle, or multi-layer ceramic piezoceramic material, or a piezoceramic material with grooves.

* * * * *